(12) United States Patent
Shinmura

(10) Patent No.: US 6,495,438 B1
(45) Date of Patent: Dec. 17, 2002

(54) TITANIUM POLYCIDE GATE ELECTRODE AND METHOD OF FORMING A TITANIUM POLYCIDE GATE ELECTRODE OF A SEMICONDUCTOR DEVICE

(75) Inventor: Toshiki Shinmura, Tokyo (JP)

(73) Assignee: NEC Corporation, Tokyo (JP)

( * ) Notice: Subject to any disclaimer, the term of this patent is extended or adjusted under 35 U.S.C. 154(b) by 2 days.

(21) Appl. No.: 09/651,676

(22) Filed: Aug. 30, 2000

(30) Foreign Application Priority Data

Aug. 30, 1999 (JP) .......................................... 11-243446

(51) Int. Cl.$^7$ .................. H01L 21/3205; H01L 21/4763
(52) U.S. Cl. ........................................ 438/592; 438/664
(58) Field of Search ................................ 438/289, 303, 438/592, 586, 630, 648, 649, 682, 683, 685, 655, 656, 581, 582, 583, 299, 300, 301, 320, 229, 663, 664

(56) References Cited

U.S. PATENT DOCUMENTS 5,070,038 A * 12/1991 Jin .............................. 438/592
5,998,286 A * 12/1999 Chen et al. ................... 438/586
6,143,645 A * 11/2000 Hsu et al. .................... 438/627
6,147,405 A * 11/2000 Hu .............................. 257/755

FOREIGN PATENT DOCUMENTS

KR 10-0310907 9/2001

OTHER PUBLICATIONS

Y. Hiura et al. "Integration Technorology of Polymetal (W/WSiN/Poly–Si) Dual Gate CMOS for 1Gbit DRAMs and Beyon" 1998 IEEE, IEDM 98, pp. 389–392.

* cited by examiner

Primary Examiner—David Nelms
Assistant Examiner—David Nhu
(74) Attorney, Agent, or Firm—McGinn & Gibb, PLLC

(57) ABSTRACT

The present invention provides a method of forming a titanium polycide gate electrode. The method comprises the step of: forming a gate insulation film a top surface of a semiconductor substrate; forming a polysilicon layer on the gate insulation film; forming a silicon-rich titanium silicide layer on the polysilicon layer by a sputtering process so that a compositional ratio of silicon to titanium of the silicon-rich titanium silicide layer exceeds 2, where preferably the compositional ratio of titanium to silicon is in the range of 1:2.3 to 1:2.5 and more preferably 1:2.4; patterning laminations of the polysilicon layer and the silicon-rich titanium silicide layer to form a titanium polycide gate electrode on the gate insulation film; and subjecting the titanium polycide gate electrode to a rapid thermal oxidation, whereby excess silicon in surface regions of the silicon-rich titanium silicide layer and the polysilicon layers are oxidized, whilst the silicon-rich titanium silicide layer, except for the surface region, remains unchanged in silicon-rich titanium silicide state.

24 Claims, 21 Drawing Sheets

TITANIUM POLYCIDE GATE ELECTRODE AND METHOD OF FORMING A TITANIUM POLYCIDE GATE ELECTRODE OF A SEMICONDUCTOR DEVICE

BACKGROUND OF THE INVENTION

1. Field of the Invention

The present invention relates to a method of forming a semiconductor device, and more particularly to a novel titanium polycide gate electrode and a method of forming a titanium polycide gate electrode which has a reduced sheet resistance which is highly stable and also has a high stability in shape.

2. Description of the Related Art

In recent years, in order to reduce the resistance of the gate electrode of the transistor, a double layered gate electrode has been used which has a polysilicon layer and a titanium silicide layer on the polysilicon layer. This gate electrode is so called to as titanium polycide gate electrode.

A conventional method of forming a polycide gate electrode will be described with reference to drawings. FIGS. 1A through 1D are fragmentary cross sectional elevation views illustrative of semiconductor devices with polycide gate electrodes in sequential steps involved in a conventional fabrication method for forming the polycide gate electrode.

With reference to FIG. 1A, shallow trench isolations 12 are selectively formed in an upper region of a silicon substrate 10 so that the shallow trench isolations 12 define device regions. A gate oxide film 14 is formed on the device regions of the silicon substrate 10. A polysilicon film 16 is entirely formed on the gate oxide film 14 and also on top portions of the shallow trench isolations 12.

With reference to FIG. 1B, a $TiSi_2$ film 18 having a compositional ratio of Ti:Si=1:2 is then entirely deposited by a sputtering method on an entire top surface of the polysilicon film 16. An SiN film 20 is then entirely formed on an entire top surface of the $TiSi_2$ film 18.

With reference to FIG. 1C, a resist film is entirely applied on the top surface of the SiN film 20. A lithography process is carried out to pattern the SiN film 20, whereby an etching mask 22 is selectively formed on a predetermined area of the top surface of the $TiSi_2$ film 18.

With reference to FIG. 1D, an anisotropic etching is then carried out by use of the etching mask 22 for selectively removing laminations of the $TiSi_2$ film 18, the polysilicon film 16 and the gate oxide film 14 except under the etching mask 22. The used etching mask 22 is then removed. As a result, the gate electrode is formed on the gate oxide film 14, wherein the gate electrode has a double layered structure which comprises the polysilicon film 16 and the $TiSi_2$ film 18.

The above conventional method uses the anisotropic etching process by use of the etching mask 22 for selectively etching the laminations of the $TiSi_2$ film 18, the polysilicon film 16 and the gate oxide film 14 except under the etching mask 22, whereby the top surface of the silicon substrate 10 is shown. The top surface of the silicon substrate 10 receives a damage during the anisotropic etching process for patterning the gate electrode, whereby a surface region of the silicon substrate receives the damage. Namely, a surface damage layer is formed on the surface region of the silicon substrate 10.

FIG. 2 is a fragmentary cross sectional elevation view illustrative of a semiconductor device with a polycide gate electrode after a rapid thermal oxidation process has been carried out to oxidize a damage layer in accordance with one additional step involved in the conventional fabrication method. In order to attempt to solve the above problem with formation of the damage layer, a rapid thermal oxidation process is carried out for oxidizing the damage layer so that the damage layer becomes an extremely thin silicon dioxide layer 24. Particularly if silicon nitride side walls are formed on side walls of the gate electrode, then the silicon dioxide film 24 covering the top surface of the silicon substrate 10 improves the resistivity to the hot-carrier.

It had, however, been reported in IEEE 1998, IEDM 98, pp. 389–392, that it is difficult to carry out the rapid thermal oxidation to the substrate with the titanium polycide gate electrode.

The lamp annealer is used to carry out a rapid thermal oxidation at a temperature of 1000° C. for 60 seconds in an oxygen atmosphere in order to oxidize the damage layer on the top surface of the silicon substrate 10 so that the damage layer becomes the extremely thin silicon dioxide film 24 having a thickness of about 50 angstroms. This extremely thin silicon oxide film 24 also serves as a passivation layer for protecting the top surface of the silicon substrate 10 from an ion-implantation to be carried out for forming diffusion layers in upper regions of the silicon substrate 10.

FIG. 3 is a fragmentary cross sectional elevation view illustrative of a semiconductor device with a titanium polycide gate electrode which has been broken by the rapid thermal oxidation process carried out for oxidizing the damage layer on the top surface of the silicon substrate 10. Namely, it is possible that the rapid thermal oxidation process for oxidizing the damage layer on the top surface of the silicon substrate 10 causes the lamination structure of the titanium polycide gate electrode to be broken or one layer of the lamination structure to be peeled. As a result, the sheet resistance of the gate electrode is increased and the stability of the sheet resistance of the gate electrode is reduced. This makes it invalid to form the polycide structure gate electrode, if the polycide structure is to reduce the resistance of the gate electrode.

The above problem is common not only to the polycide gate electrode but also to any polycide layers such as a polycide interconnection.

In the above circumstances, it had been required to develop a novel method of forming a polycide gate electrode free from the above problem.

SUMMARY OF THE INVENTION

Accordingly, it is an object of the present invention to provide a novel a titanium polycide layer free from the above problems.

It is another object of the present invention to provide a novel a titanium polycide layer having a reduced sheet resistance which is highly stable.

It is still another object of the present invention to provide a novel a titanium polycide layer having a high stability of lamination structure or shape.

It is yet another object of the present invention to provide a novel titanium polycide gate electrode of a semiconductor device free from the above problems.

It is still more another object of the present invention to provide a novel titanium polycide gate electrode of a semiconductor device having a reduced sheet resistance which is highly stable.

It is yet more another object of the present invention to provide a novel titanium polycide gate electrode of a semiconductor device having a high stability of lamination structure or shape.

It is an additional object of the present invention to provide a novel semiconductor device with an improved titanium polycide gate electrode free from the above problems.

It is a still additional object of the present invention to provide a novel semiconductor device with an improved titanium polycide gate electrode having a reduced sheet resistance which is highly stable.

It is yet an additional object of the present invention to provide a novel semiconductor device with an improved titanium polycide gate electrode having a high stability of lamination structure or shape.

It is still another object of the present invention to provide a novel method of forming a titanium polycide layer free from the above problems.

It is a further object of the present invention to provide a novel method of forming a polycide layer having a reduced sheet resistance which is highly stable.

It is a still further object of the present invention to provide a novel method of forming a polycide layer having a high stability of lamination structure or shape.

It is yet a further object of the present invention to provide a novel method of forming a titanium polycide gate electrode free from the above problems.

It is yet more object of the present invention to provide a novel method of forming a titanium polycide gate electrode having a reduced sheet resistance which is highly stable.

It is still more object of the present invention to provide a novel method of forming a titanium polycide gate electrode having a high stability of lamination structure or shape.

It is further more object of the present invention to provide a novel method of forming a semiconductor device with a titanium polycide gate electrode free from the above problems.

It is moreover object of the present invention to provide a novel method of forming a semiconductor device with a titanium polycide gate electrode having a reduced sheet resistance which is highly stable.

It is another object of the present invention to provide a novel method of forming a semiconductor device with a titanium polycide gate electrode having a high stability of lamination structure or shape.

The first present invention provides a titanium polycide layered structure comprising: a polysilicon layer; and a silicon-rich titanium silicide layer extending on the polysilicon layer, wherein a compositional ratio of silicon to titanium of the silicon-rich titanium silicide layer exceeds 2, where preferably the compositional ratio of titanium to silicon is in the range of 1:2.3 to 1:2.5 and more preferably 1:2.4.

The other present invention provides a method of forming a titanium polycide gate electrode. The method comprises the step of: forming a gate insulation film a top surface of a semiconductor substrate; forming a polysilicon layer on the gate insulation film; forming a silicon-rich titanium silicide layer on the polysilicon layer by a sputtering process so that a compositional ratio of silicon to titanium of the silicon-rich titanium silicide layer exceeds 2, where preferably the compositional ratio of titanium to silicon is in the range of 1:2.3 to 1:2.5 and more preferably 1:2.4 patterning laminations of the polysilicon layer and the silicon-rich titanium silicide layer to form a titanium polycide gate electrode on the gate insulation film; and subjecting the titanium polycide gate electrode to a rapid thermal oxidation, whereby excess silicon in surface regions of the silicon-rich titanium silicide layer and the polysilicon layers are oxidized, whilst the silicon-rich titanium silicide layer, except for the surface region, remains unchanged in silicon-rich titanium silicide state.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

As described above, it is possible that the rapid thermal oxidation process for oxidizing the damage layer on the top surface of the silicon substrate causes the lamination structure of the titanium polycide gate electrode to be broken or one layer of the lamination structure to be peeled. As a result, the sheet resistance of the gate electrode is increased and the stability of the sheet resistance of the gate electrode is reduced. The film peeling or breaking may be caused by the following. The above conventional titanium silicide layer on the polysilicon layer of the titanium polycide gate has a compositional ratio of titanium to silicon of 1:2. The rapid thermal oxidation process for oxidizing the damage layer on the top surface of the silicon substrate causes titanium of the titanium silicide layer to be oxidized, whereby a planarity of the $TiSi_2$ layer is lost by the rapid thermal oxidation process for oxidizing the damage layer on the top surface of the silicon substrate.

Figure 1A:
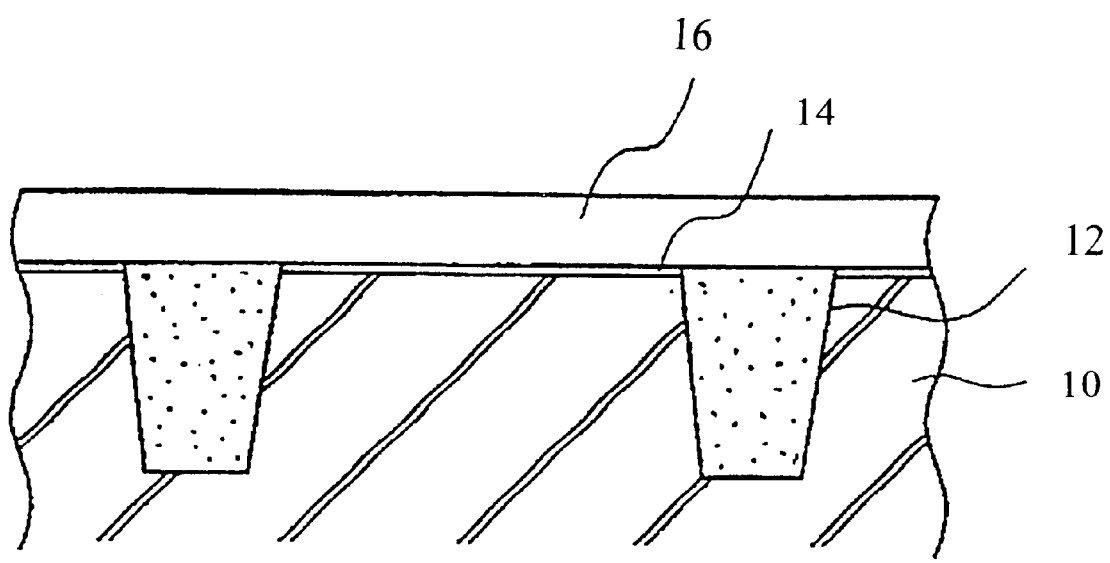
FIGS. 1A through 1D are fragmentary cross sectional elevation views illustrative of semiconductor devices with polycide gate electrodes in sequential steps involved in a conventional fabrication method for forming the polycide gate electrode.
Figure 1B:
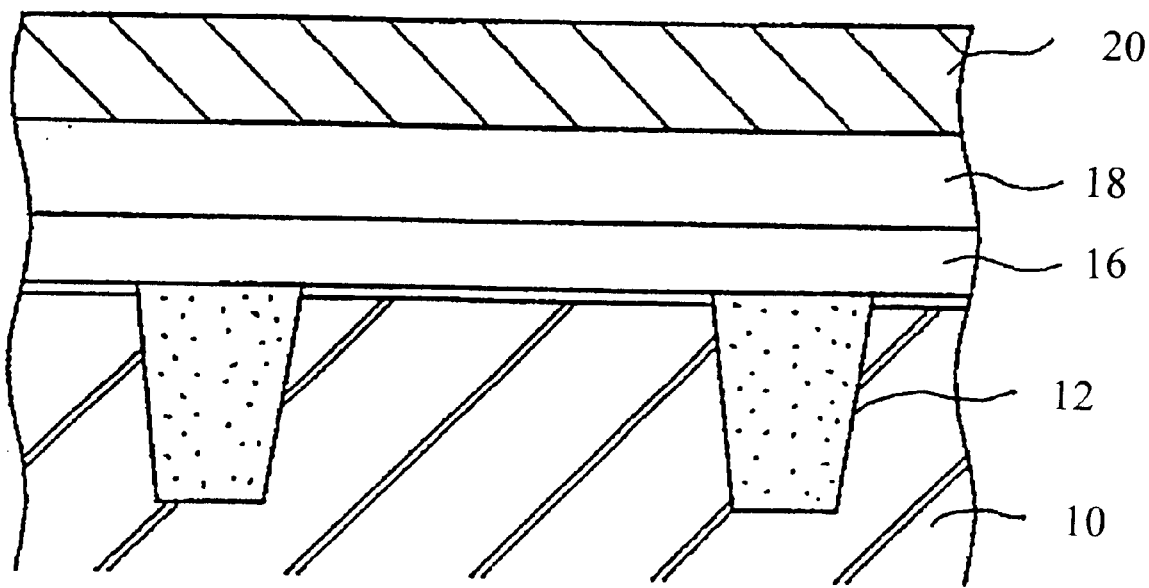
Figure 1C:
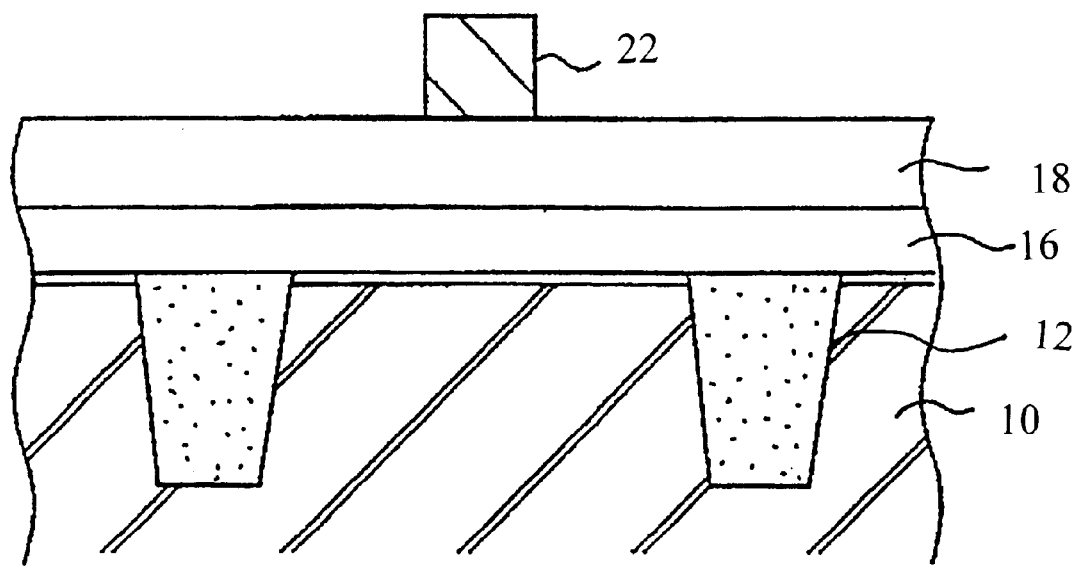
Figure 1D:
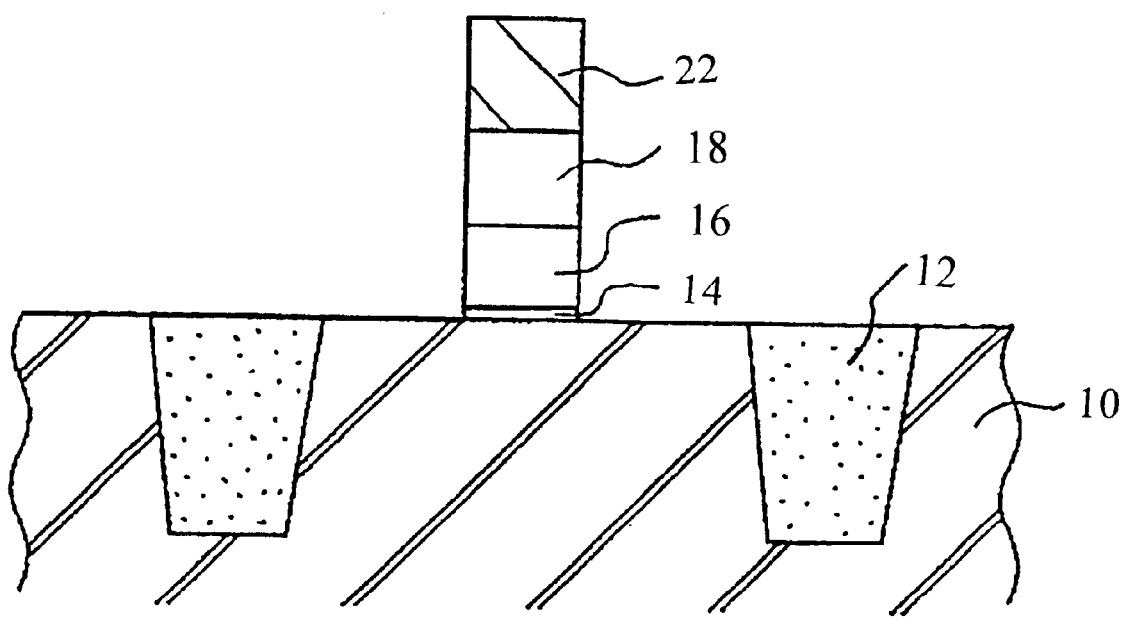
Figure 2:
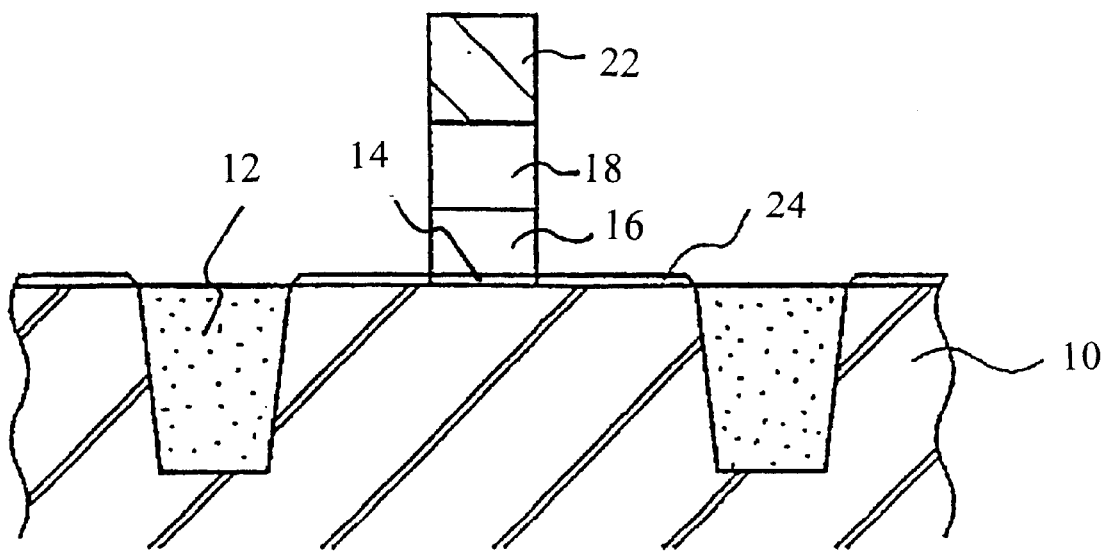
FIG. 2 is a fragmentary cross sectional elevation view illustrative of a semiconductor device with a polycide gate electrode after a rapid thermal oxidation process has been carried out to oxidize a damage layer in accordance with one additional step involved in the conventional fabrication method.
Figure 3:
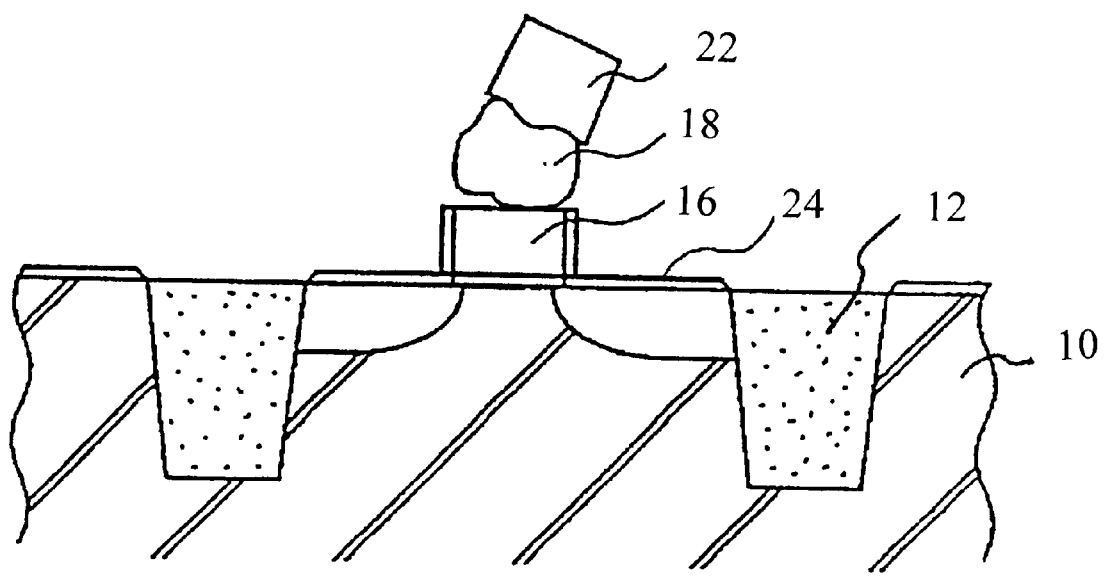
FIG. 3 is a fragmentary cross sectional elevation view illustrative of a semiconductor device with a titanium polycide gate electrode which has been broken by the rapid thermal oxidation process carried out for oxidizing the damage layer on the top surface of the silicon substrate.
Figure 4:
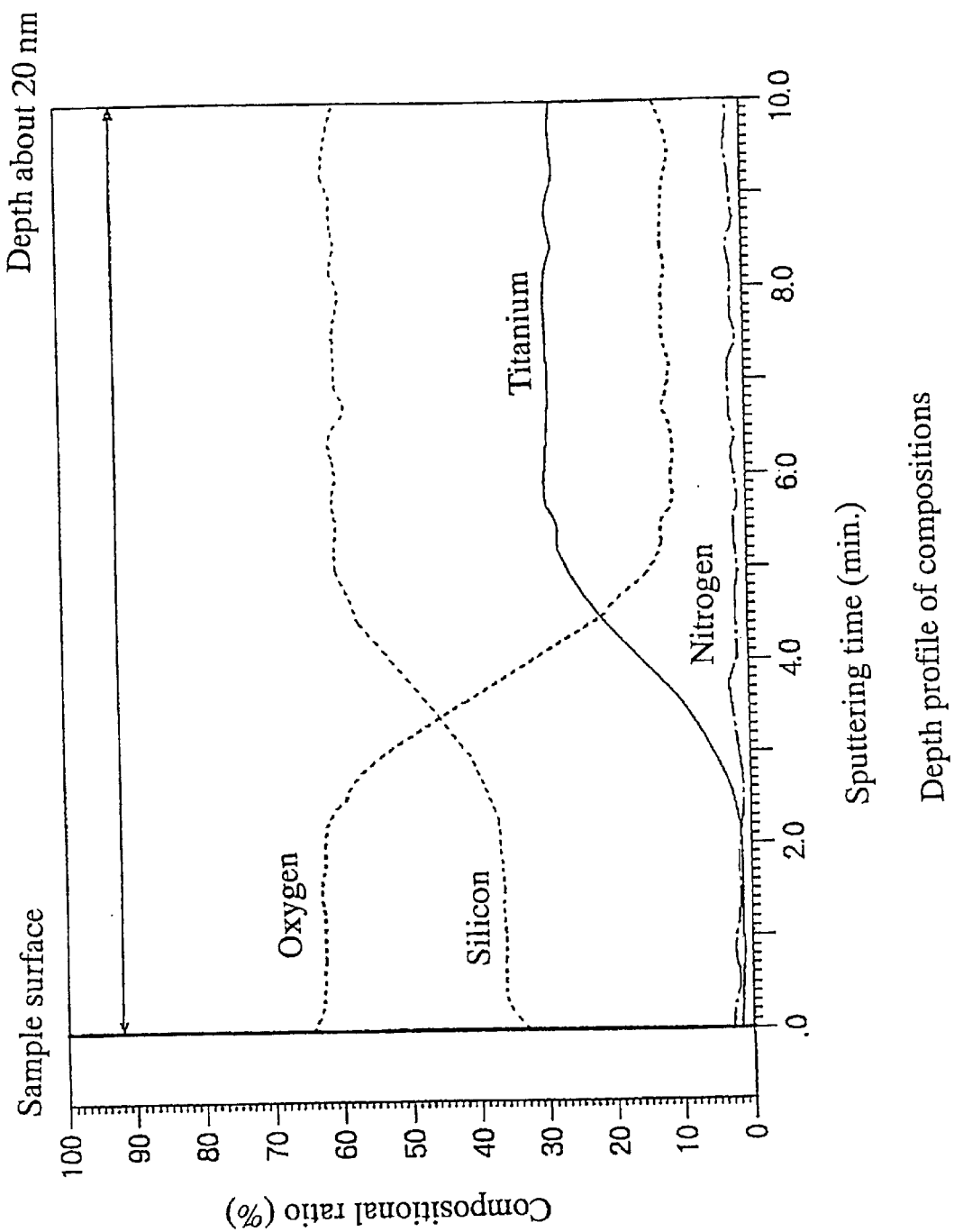
FIG. 4 is a diagram illustrative of an elemental composition depth profile of the silicon-rich titanium suicide layer, where a vertical axis represents individual compositional ratios of silicon, titanium oxygen and nitrogen, whilst a horizontal axis represents a sputter-etching time for sputter-etching a surface of the silicon-rich titanium silicide layer for obtaining informations about variations in the elemental compositional ratio versus the depth of the silicon-rich titanium silicide layer.

In accordance with the present invention, in order to prevent titanium of the titanium silicide layer to be oxidized by the rapid thermal oxidation process for oxidizing the damage layer on the top surface of the silicon substrate, a compositional ratio of titanium to silicon of the titanium silicide layer extending over the polysilicon layer is modified. Namely, in place of the conventional $TiSi_2$ layer, a silicon-rich titanium silicide layer is formed on the polysilicon layer, wherein a compositional ratio of silicon to titanium exceeds 2. Preferably, a compositional ratio of titanium to silicon is in the range of 1:2.3 to 1:2.5, and more preferably 1:2.4. The silicon-rich titanium silicide layer having a titanium-to-silicon compositional ratio of 1:2.4 is formed on the polysilicon layer. A sample of the lamination of the polysilicon layer and the overlying silicon-rich titanium silicide layer is then subjected to a rapid thermal oxidation process for 60 seconds in an oxygen atmosphere at a temperature of 1000° C. An elemental composition depth profile of the silicon-rich titanium silicide layer after having been subjected to the rapid thermal oxidation process carried out for 60 seconds in an oxygen atmosphere at a temperature of 1000° C. is obtained by a sputter-etching process for sputter-etching a surface of the silicon-rich titanium silicide layer. FIG. 4 is a diagram illustrative of an elemental composition depth profile of the silicon-rich titanium silicide layer, where a vertical axis represents individual compositional ratios of silicon, titanium oxygen and nitrogen, whilst a horizontal axis represents a sputter-etching time for sputter-etching a surface of the silicon-rich titanium silicide layer for obtaining informations about variations in the elemental compositional ratio versus the depth of the silicon-rich titanium silicide layer. The sputter-etching time substantially corresponds to the depth from the sample surface or the surface of the silicon-rich titanium silicide layer and also represents. For example, if the sputter-etching time is 10 minutes, then this corresponds to the depth of about 20 nanometers. The reason, why the horizontal axis does not directly represent the depth from the surface of the silicon-rich titanium silicide layer, is that the sputter-etching rate varies depending upon the compositional ratio and the crystal structure and it is difficult to accurately convert the sputter-etching time to the depth. The vertical axis represents the ratio in the number of atoms of the compositional elements. A few percents comprises a noise and does not include any substantive elements. Namely, even nitrogen is represented within a few percents, but actually no nitrogen is detected.

If the sputter-etching time is about 2 minutes which corresponds to the depth of about 40 angstroms, a small amount of titanium is detected to be within a few percents, and actually no titanium is present, whilst a compositional ratio of silicon to oxygen is 1:2. This means that an upper surface region having the depth of about 40 angstroms in the silicon-rich titanium silicide layer comprises an $SiO_2$ layer. Namely, the upper surface region having the depth of about 40 angstroms in the silicon-rich titanium silicide layer is changed into the silicon dioxide layer or $SiO_2$ layer by the rapid thermal oxidation process.

If the sputter-etching time is about 6 minutes or later which corresponds to the depth of about 120 angstroms or deeper, then An oxygen compositional ratio is reduced whilst the compositional ratio of silicon to titanium is more than 2. This means that the deep region having the depth of not less than about 120 angstroms in the silicon-rich titanium silicide layer comprises a silicon-rich titanium silicide layer. Namely, the deep region having the depth of not less than about 120 angstroms in the silicon-rich titanium suicide layer remains changed in the silicon-rich titanium silicide even after the rapid thermal oxidation process has been carried out. Accordingly, the silicon-rich titanium silicide layer is free from the oxidation of titanium, except for the upper surface region having the depth of about 40 angstroms in the silicon-rich titanium silicide layer. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized.

As described above, even if the rapid thermal oxidation process is carried out for oxidizing the damage layer on the top surface of the silicon substrate, then the silicon-rich titanium silicide layer is free from the oxidation of titanium, except for the upper surface region having the depth of about 40 angstroms in the silicon-rich titanium silicide layer, whereby the lamination structure of the titanium polycide gate electrode remains unchanged and no layer of the lamination structure is peeled. As a result, the sheet resistance of the gate electrode remains low and the stability of the sheet resistance of the gate electrode remains high. No film peeling nor breaking of the gate electrode is caused.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to he oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor breaking of the gate electrode is caused.

Accordingly, the first present invention provides a titanium polycide layered structure comprising: a polysilicon layer; and a silicon-rich titanium silicide layer extending on the polysilicon layer, wherein a compositional ratio of silicon to titanium of the silicon-rich titanium silicide layer exceeds 2.

It is preferable that a compositional ratio of titanium to silicon of the silicon-rich titanium silicide layer is in the range of 1:2.3 to 1:2.5. In this case, it is further preferable that the compositional ratio of titanium to silicon of the silicon-rich titanium silicide layer is 1:2.4.

It is also preferable that the titanium polycide layered structure comprises a titanium polycide gate electrode.

It is also preferable that the titanium polycide layered structure comprises a titanium polycide interconnection.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor breaking of the gate electrode is caused.

The second present invention provides a titanium polycide gate electrode on a gate insulation film over a semiconductor substrate. The titanium polycide gate electrode comprises: a polysilicon layer; and a silicon-rich titanium silicide layer extending on the polysilicon layer, wherein a compositional ratio of silicon to titanium of the silicon-rich titanium silicide layer exceeds 2.

It is preferable that a compositional ratio of titanium to silicon of the silicon-rich titanium silicide layer is in the range of 1:2.3 to 1:2.5. In this case, it is further preferable that the compositional ratio of titanium to silicon of the silicon-rich titanium silicide layer is 1:2.4.

It is preferable to further comprise silicon nitride side wall insulation films on side walls of the titanium polycide gate electrode.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor breaking of the gate electrode is caused.

The third present invention provides a semiconductor device comprises a semiconductor substrate; source and drain diffusion regions selectively provided in upper regions in the semiconductor substrate; a gate insulation film on a channel region of the semiconductor substrate defined between the source and drain diffusion regions; and a titanium polycide gate electrode on the gate insulation film, the titanium polycide gate electrode comprising a polysilicon layer, and a silicon-rich titanium silicide layer extending on the polysilicon layer, wherein a compositional ratio of silicon to titanium of the silicon-rich titanium silicide layer exceeds 2.

It is preferable that a compositional ratio of titanium to silicon of the silicon-rich titanium silicide layer is in the range of 1:2.3 to 1:2.5. In this case, it is further, preferable that the compositional ratio of titanium to silicon of the silicon-rich titanium silicide layer is 1:2.4.

It is preferable to further comprise silicon nitride side wall insulation films on side walls of the titanium polycide gate electrode.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor breaking of the gate electrode is caused.

The fourth present invention provides a method of forming a titanium polycide layered structure. The method comprises the step of: forming a silicon-rich titanium silicide layer on a polysilicon layer by a sputtering process so that a compositional ratio of silicon to titanium of the silicon-rich titanium suicide layer exceeds 2.

It is preferable to further comprise the step of: subjecting the titanium polycide layered structure to a rapid thermal oxidation, whereby excess silicon in surface regions of the silicon-rich titanium silicide layer and the polysilicon layer are oxidized, whilst the silicon-rich titanium silicide layer, except for the surface region, remains unchanged in silicon-rich titanium silicide state.

It is further preferable that the rapid thermal oxidation is carried out at a temperature in the range of 950° C. to 1050° C. in an oxygen atmosphere for a time period in the range of 30 seconds to 90 seconds for oxidizing the surface regions with a depth in the range of 4 nanometers to 8 nanometers to form a silicon dioxide film having a thickness in the range of 4 nanometers to 8 nanometers on the surface regions.

It is also preferable that the silicon-rich titanium silicide layer is formed by the sputtering method so that a compositional ratio of titanium to silicon of the silicon-rich titanium silicide layer is in the range of 1:2.3 to 1:2.5. In this case, it is further preferable that the silicon-rich titanium silicide layer is formed by the sputtering method so that a compositional ratio of titanium to silicon of the silicon-rich titanium silicide layer is 1:2.4.

It is also preferable that the silicon-rich titanium silicide layer is formed by the steps of: carrying out a sputtering process to deposit an amorphous silicon-rich titanium silicide layer on the polysilicon layer so that a compositional ratio of silicon to titanium of the amorphous silicon-rich titanium silicide layer exceeds 2; and subjecting the amorphous silicon-rich titanium silicide layer to a heat treatment to cause crystallization of the amorphous silicon-rich titanium silicide layer to form the silicon-rich titanium silicide layer.

It is preferable that the compositional ratio of titanium to silicon of the amorphous silicon-rich titanium silicide layer is in the range of 1:2.3 to 1:2.5. In this case, it is preferable that the compositional ratio of titanium to silicon of the amorphous silicon-rich titanium silicide layer is 1:2.4.

It is also preferable that the silicon-rich titanium silicide layer is formed by the step of: carrying out a sputtering process at a temperature of not less than 400° C. to deposit a crystallized silicon-rich titanium silicide layer on the polysilicon layer so that a compositional ratio of silicon to titanium of the crystallized silicon-rich titanium silicide layer exceeds 2. In this case, it is further preferable that the compositional ratio of titanium to silicon of the crystallized silicon-rich titanium silicide layer is in the range of 1:2.3 to 1:2.5. It is further more preferable that the compositional ratio of titanium to silicon of the crystallized silicon-rich titanium silicide layer is 1:2.4.

It is preferable to further comprise the step of: patterning laminations of the silicon-rich titanium suicide layer on the polysilicon layer to form a titanium polycide gate electrode before the titanium polycide gate electrode is subjected to the rapid thermal oxidation.

It is also preferable to further comprise the step of: patterning laminations of the silicon-rich titanium silicide layer on the polysilicon layer to form a titanium silicide interconnection before the titanium silicide interconnection is subjected to the rapid thermal oxidation.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor breaking of the gate electrode is caused.

The fifth present invention provides a method of forming a titanium polycide gate electrode. The method comprises the step of: forming a gate insulation film a top surface of a semiconductor substrate; forming a polysilicon layer on the gate insulation film; forming a silicon-rich titanium silicide layer on the polysilicon layer by a sputtering process so that a compositional ratio of silicon to titanium of the silicon-rich titanium silicide layer exceeds 2; patterning laminations of the polysilicon layer and the silicon-rich titanium silicide layer to form a titanium polycide gate electrode on the gate insulation film; and subjecting the titanium polycide gate electrode to a rapid thermal oxidation, whereby excess silicon in surface regions of the silicon-rich titanium silicide layer and the polysilicon layers are oxidized, whilst the silicon-rich titanium silicide layer, except for the surface region, remains unchanged in silicon-rich titanium silicide state.

It is preferable that the rapid thermal oxidation is carried out at a temperature in the range of 950° C. to 1050° C. in an oxygen atmosphere for a time period in the range of 30 seconds to 90 seconds for oxidizing the surface regions with a depth in the range of 4 nanometers to 8 nanometers to form a silicon dioxide film having a thickness in the range of 4 nanometers to 8 nanometers on the surface regions.

It is also preferable that the silicon-rich titanium silicide layer is formed by the sputtering method so that a compositional ratio of titanium to silicon of the silicon-rich titanium silicide layer is in the range of 1:2.3 to 1:2.5. In this case, it is further preferable that the silicon-rich titanium silicide layer is formed by the sputtering method so that a compositional ratio of titanium to silicon of the silicon-rich titanium silicide layer is 1:2.4.

It is also preferable that the silicon-rich titanium silicide layer is formed by the steps of: carrying out a sputtering process to deposit an amorphous silicon-rich titanium silicide layer on the polysilicon layer so that a compositional ratio of silicon to titanium of the amorphous silicon-rich titanium silicide layer exceeds 2; and subjecting the amorphous silicon-rich titanium silicide layer to a heat treatment to cause crystallization of the amorphous silicon-rich titanium silicide layer to form the silicon-rich titanium silicide layer. In this case, it is further preferable that the compositional ratio of titanium to silicon of the amorphous silicon-rich titanium silicide layer is in the range of 1:2.3 to 1:2.5. In this case, it is further more preferable that the compositional ratio of titanium to silicon of the amorphous silicon-rich titanium silicide layer is 1:2.4.

It is preferable that the silicon-rich titanium silicide layer is formed by the step of: carrying out a sputtering process at a temperature of not less than 400° C. to deposit a crystallized silicon-rich titanium silicide layer on the polysilicon layer so that a compositional ratio of silicon to titanium of the crystallized silicon-rich titanium silicide layer exceeds 2. In this case, it is further preferable that the compositional ratio of titanium to silicon of the crystallized silicon-rich titanium silicide layer is in the range of 1:2.3 to 1:2.5. It is further more preferable that the compositional ratio of titanium to silicon of the crystallized silicon-rich titanium silicide layer is 1:2.4.

It is preferable to further comprise the step of: after the rapid thermal oxidation, forming silicon nitride side wall layers on side walls of the titanium polycide gate electrode.

The above novel silicon-rich titanium silicide layer on the polysilicon layer of the titanium polycide gate has a compositional ratio of silicon to titanium which exceeds 2, wherein preferably a compositional ratio of titanium to silicon is in the range of 1:2.3 to 1:2.5 and more preferably is 1:2.4. The rapid thermal oxidation process for oxidizing the damage layer on the top surface of the silicon substrate causes excess silicon to be oxidized in the upper surface region having the depth of about 40 angstroms, but does not cause titanium of the titanium silicide layer to be oxidized, whereby a planarity of the $TiSi_{2.4}$ layer is maintained by the rapid thermal oxidation process for oxidizing the damage layer on the top surface of the silicon substrate. As a result, the sheet resistance of the gate electrode remains low and the stability of the sheet resistance of the gate electrode remains high. No film peeling nor braking of the gate electrode is caused.

PREFERRED EMBODIMENT

First Embodiment

A first embodiment according to the present invention will be described in detail with reference to the drawings. FIGS. 5A through 5G are fragmentary cross sectional elevation views illustrative of semiconductor devices with titanium polycide gate electrodes in sequential steps involved in a novel method of forming the semiconductor device in a first embodiment according to the present invention. FIG. 6 is a cross sectional schematic view illustrative of a sputtering system to be used for depositing a titanium silicide layer on a polysilicon layer to form a titanium polycide gate electrode of the semiconductor device in one step involved in the novel fabrication method in a first embodiment according to the present invention.

Figure 5A:
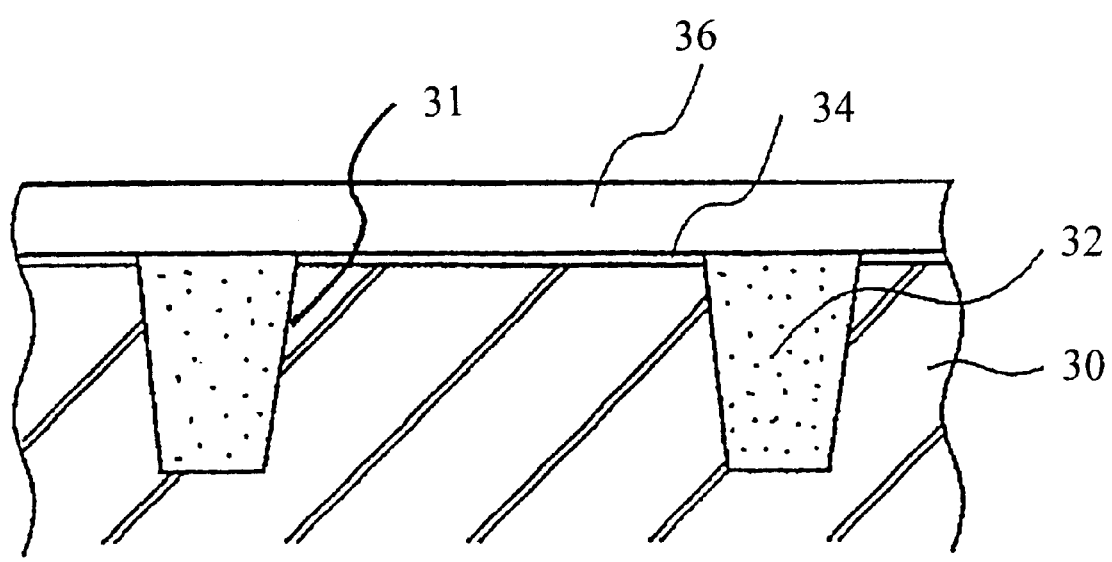
FIGS. 5A through 5G are fragmentary cross sectional elevation views illustrative of semiconductor devices with titanium polycide gate electrodes in sequential steps involved in a novel method of forming the semiconductor device in a first embodiment according to the present invention.
Figure 6:
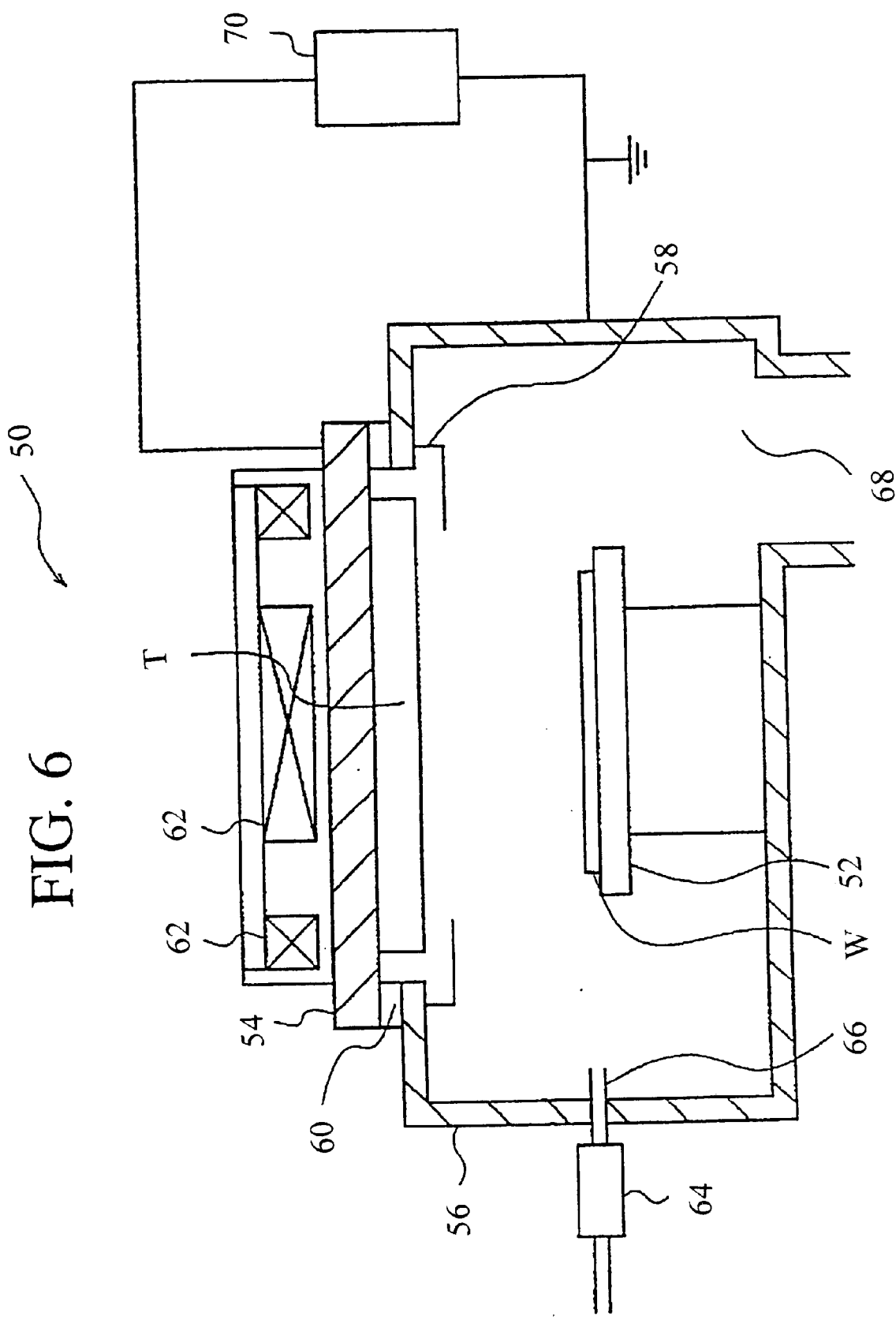
FIG. 6 is a cross sectional schematic view illustrative of a sputtering system to be used for depositing a titanium silicide layer on a polysilicon layer to form a titanium polycide gate electrode of the semiconductor device in one step involved in the novel fabrication method in a first embodiment according to the present invention.

With reference to FIG. 5A, shallow trench isolation grooves 31 are selectively formed in an upper region of a silicon substrate 30 and subsequently shallow trench isolations 32 are formed within the trench isolation grooves 31 by use of a shallow trench isolation technique, whereby a device region of a top surface of the silicon substrate 30 is defined by the shallow trench isolations 32. A thermal oxidation reactor is used to carry out a thermal oxidation at a temperature of 850° C. in an oxygen atmosphere, whereby a gate oxide film 34 of $SiO_2$ is formed on the device region of the top surface of the silicon substrate 30. The gate oxide film 34 has a thickness of 5 nanometers.

A low pressure chemical vapor deposition process is carried out for entirely depositing a polysilicon film 36 which extends over the gate oxide film 34 and the top surfaces of the shallow trench isolations 32. The polysilicon film 36 has a thickness of 50 nanometers. An impurity such as phosphorus is doped into the polysilicon film 36. In order to dope phosphorus into the polysilicon film 36, the following methods are available. An ion-implantation may be carried out of ion-implanting phosphorus into the polysilicon film 36. Alternatively, a $POCl_3$ gas may be used to cause a diffusion of phosphorus into the polysilicon film 36. Further, alternatively, a $PH_3$ gas may be supplied into a growth chamber to deposit the phosphorus-doped polysilicon film 36 on the gate oxide film 34.

Figure 5B:
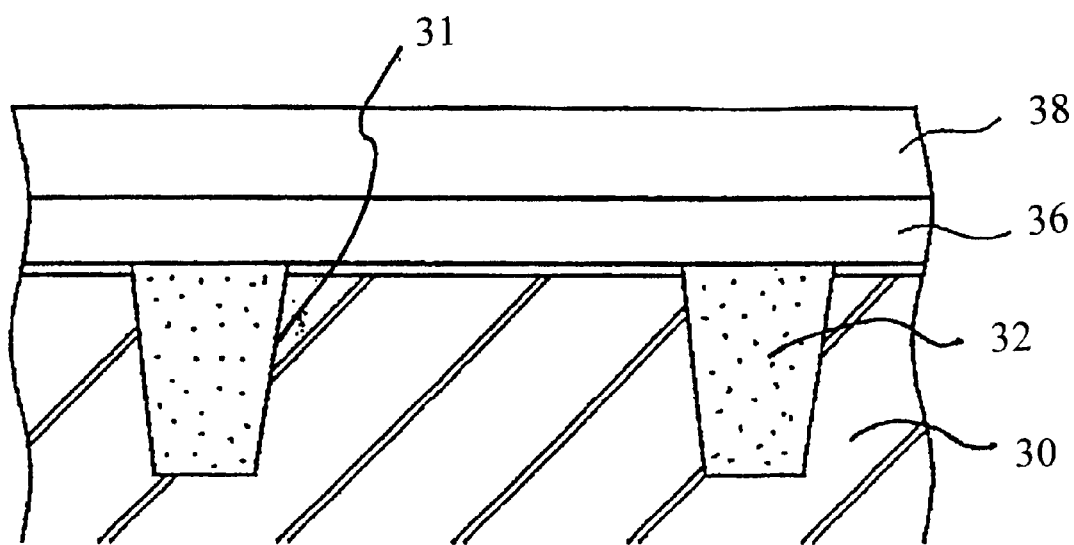

With reference to FIG. 5B, a sputtering process is carried out by sputtering a sputter-target which comprises a Ti-Si alloy having a compositional ratio of Ti to Si being 1:2.4 for depositing an amorphous silicon-rich titanium silicide layer 38' on the phosphorus-doped polysilicon film 36. The amorphous silicon-rich titanium silicide layer 38' has a compositional ratio of Ti to Si being 1:2.4. The amorphous silicon-rich titanium silicide layer 38' also has a thickness of 100 nanometers. The amorphous silicon-rich titanium silicide layer 38' is substantially identical in compositional ratio of Ti to Si to the sputter-target. The sputtering process is carried out by use of a sputtering system 50 as shown in FIG. 6. The sputtering system 50 has a sputter-chamber 56 which accommodates a substrate holder 52 which holds a semiconductor wafer "W". The sputter-chamber 56 has a top opening where a backing plate 54 is provided which serves as a sputter-target holder for holding a sputter-target "T" which comprises a Ti-Si alloy having a compositional ratio of Ti to Si being 1:2.4. Further, a side-shield 58 is provided which extends along a circumference of the top opening of the sputter-chamber 56 for surrounding the sputter-target "T" held by the backing plate 54 for preventing sputtered particles from an oblique-travelling from the sputter-target "T" toward side walls of the sputter-chamber 56. An insulator 60 is further provided on a peripheral portion of the top opening of the sputter-chamber 56. The backing plate 54 is provided on the insulator 60 so that the backing plate 54 is electrically isolated by the insulator 60. Magnets 62 are provided over the backing plate 54. A gas supply tube 66 is further provided which penetrates one side wall of the sputter-chamber 56 for allowing a sputter gas into an inner space of the sputter-chamber 56. The gas supply tube 66 has a mass flow controller 64 for controlling a flow rate of the sputter gas through the gas supply tube 66. A discharge port 68 is also formed at a part of the bottom wall of the sputter-chamber 56. The discharge port 68 is connected to a vacuum suction device such as a vacuum pump which is not illustrated, so that the vacuum suction device discharges the sputter gas in the sputter-chamber 56 through the discharge port 68. A sputter power supply 70 is further provided which is connected to the sputter-chamber 56 and the backing plate 54, so that the sputter power supply 70 applies a power across the sputter-chamber 56 and the backing plate 54 wherein the sputter-chamber 56 and the backing plate 54 are electrically isolated from each other by the isolator 60.

If oxygen is present in the sputter-chamber 56 serving on the sputtering process, then oxygen may provide any undesirable influence to the deposited silicon-rich titanium silicide layer. In order to prevent this problem, it is preferable that when the sputtering system 50 is not on operation, then the sputter-chamber 56 is filled with an inert gas and is maintained at a pressure of not more than 1 E-7 Torr. In the sputtering process, the sputter-chamber 56 is filled with argon as the sputter gas and is maintained at a pressure of about 1.1 Pa. An output of the power source 70 is set at 5 kW to apply a voltage across the sputter-chamber 56 and the backing plate 54 in order to cause a glow discharge in the sputter-chamber 56 for sputtering the sputter-target "T" which comprises the Ti-Si alloy having the compositional ratio of Ti to Si being 1:2.4 for depositing the above amorphous silicon-rich titanium silicide layer 38'.

Figure 5C:
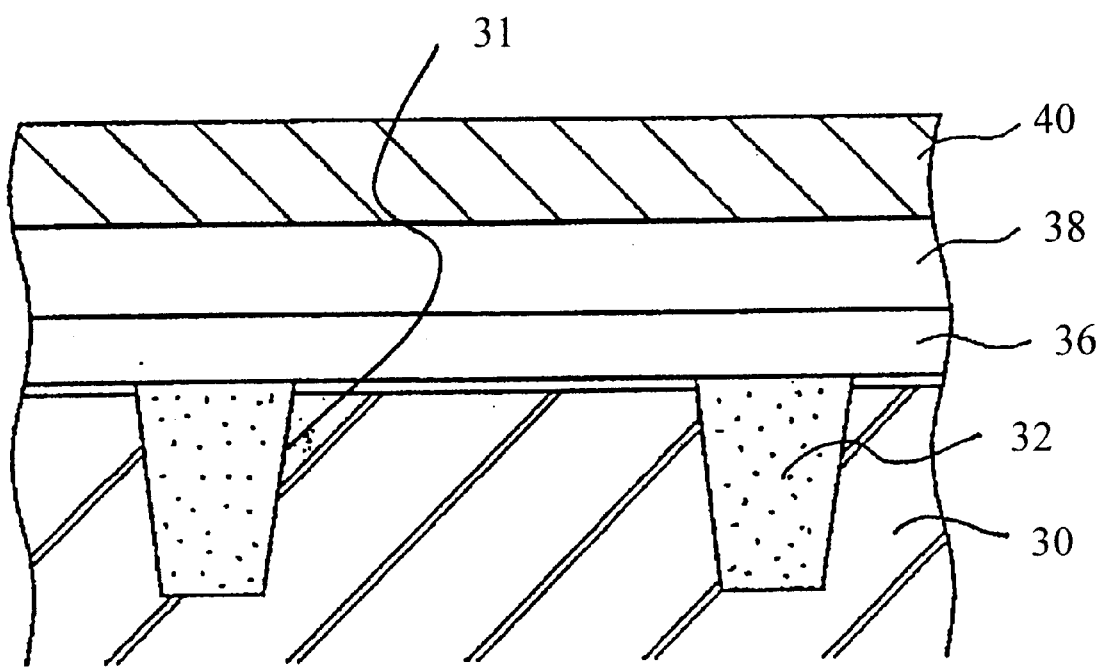

With reference FIG. 5C, a rapid thermal annealing is carried out at a temperature of 850° C. for 10 seconds in a nitrogen atmosphere so that the amorphous silicon-rich titanium silicide layer 38' is crystallized and becomes a crystallized silicon-rich titanium silicide layer 38. The crystallization of the amorphous silicon-rich titanium silicide layer 38' to form the crystallized silicon-rich titanium silicide layer 38 is carried out to obtain a stability in shape or dimension of the titanium silicide layer. If the amorphous silicon-rich titanium silicide layer 38' is patterned and subsequently the patterned amorphous silicon-rich titanium silicide layer 38' is crystallized, then the patterned crystallized silicon-rich titanium silicide layer 38 may be different in dimension or width from the amorphous silicon-rich titanium silicide layer 38'. In order to prevent this problem, it is preferable that the amorphous silicon-rich titanium silicide layer 38' is patterned before the patterned amorphous silicon-rich titanium silicide layer 38' is then crystallized to form the patterned crystallized silicon-rich titanium silicide layer 38 which is identical in dimension or width from the patterned amorphous silicon-rich titanium silicide layer 38'.

Further, a plasma enhanced chemical vapor deposition or a low pressure chemical vapor deposition is carried out to deposit a silicon nitride film 40 on the silicon-rich titanium silicide layer 38. The silicon nitride film 40 has a thickness of 100 nanometers.

Figure 5D:
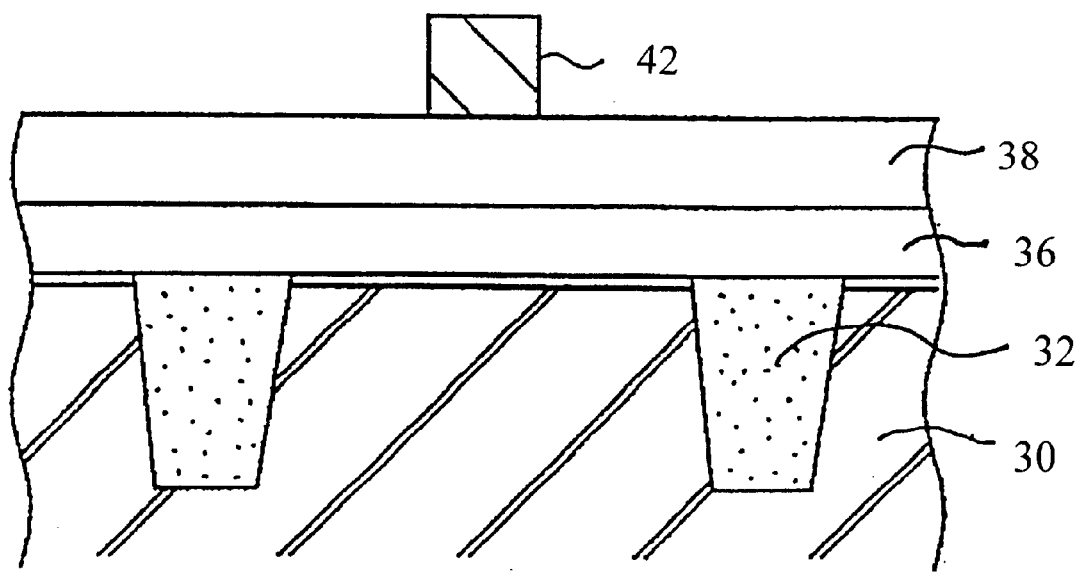

With reference to FIG. 5D, a photo-resist film not illustrated is entirely applied on the silicon nitride film 40. A photo-lithography is cried out to pattern the photo-resist film to form a photo-resist pattern on a predetermined region of the top surface of the silicon nitride film 40, wherein the photo-resist pattern is not illustrated. An isotropic etching process is then carried out by use of the photo-resist pattern as a mask and a CF-based etching gas for patterning the silicon nitride film 40, thereby to form a silicon nitride mask 42 on a predetermined region of the top surface of the silicon-rich titanium silicide layer 38. The used photo-resist pattern is then removed.

Figure 5E:
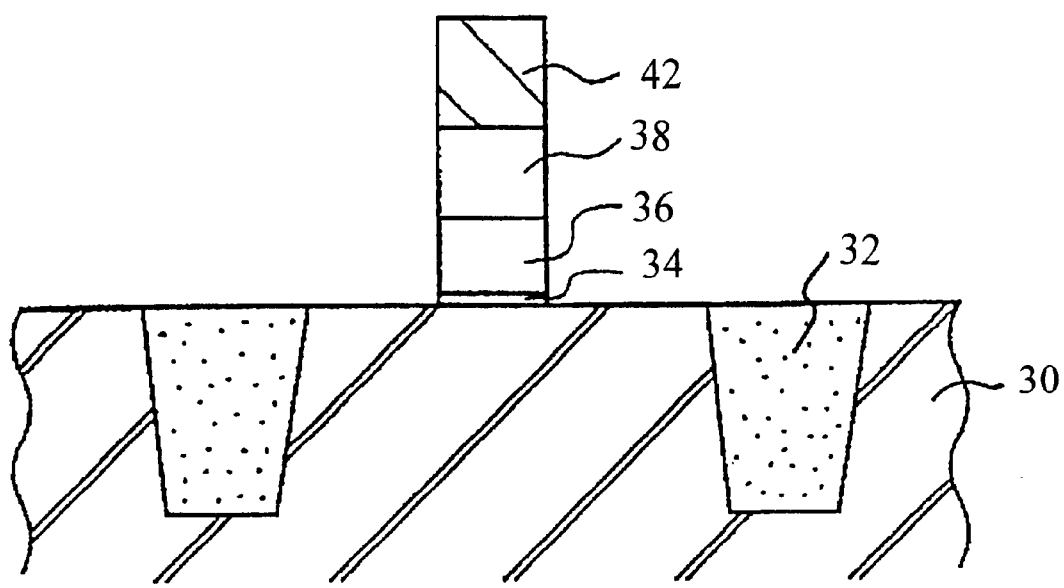

With reference to FIG. 5E, an anisotropic etching process is carried out by use of the silicon nitride mask 42 as an etching mask for selectively removing laminations of the silicon-rich titanium silicide layer 38, the phosphorous-doped polysilicon film 36 and the gate oxide film 34, whereby the silicon-rich titanium silicide layer 38 and the phosphorus-doped polysilicon film 36 are patterned to form a titanium polycide gate electrode which comprises the silicon-rich titanium silicide layer 38 and the phosphorus-doped polysilicon film 36 over the gate oxide film 34. A surface of the silicon substrate 30 receives a damage by the anisotropic etching process, whereby a damage layer is formed on the surface of the silicon substrate 30. The anisotropic etching process may be carried out under either the following first or second conditions.

First Etching Conditions:
  Sputter chamber pressure: 50 mTorr.
  Sputter gas flow rate: Hbr: 100 sccm and $O_2$:3 sccm.
  Plasma power: 300 W.
  Substrate temperature: 40° C.

Second Etching Conditions:
  Sputter chamber pressure: 30 mTorr.
  Sputter gas flow rate: Hbr: 100 sccm and $O_2$:1 sccm.
  Plasma power: 300 W.
  Substrate temperature: 80° C.

If the anisotropic etching process is carried out under the above first etching conditions, then a damage, that the surface of the silicon substrate 30 receives, is large whilst a verticality of side walls of the titanium polycide gate electrode is high. If the anisotropic etching process is carried out under the above second etching conditions, then the damage, that the surface of the silicon substrate 30 receives, is small whilst the verticality of the side walls of the titanium polycide gate electrode is low.

Figure 5F:
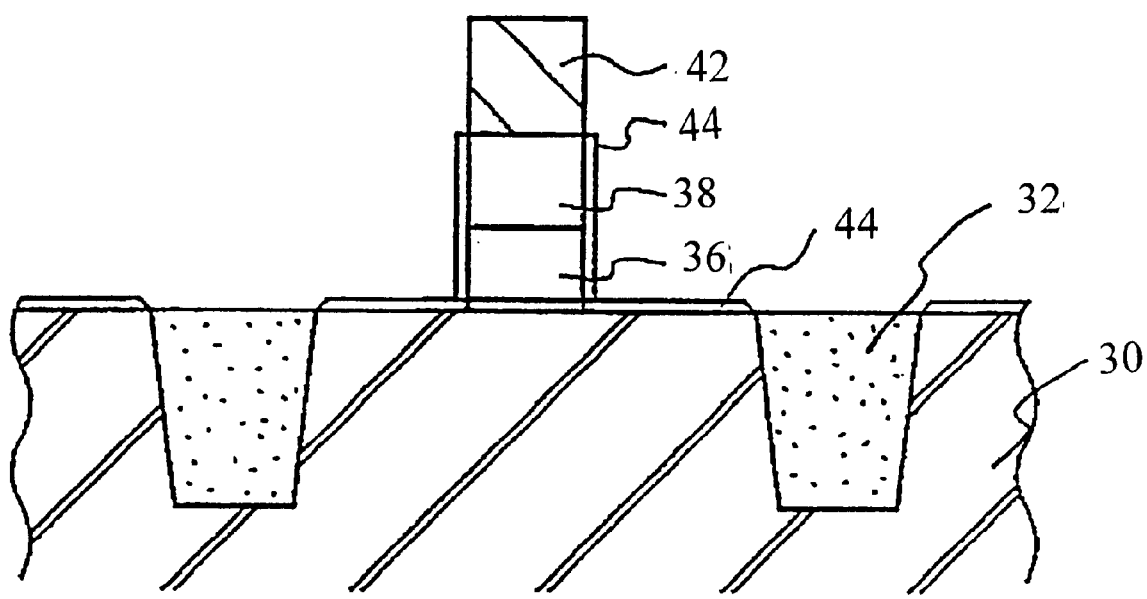

With reference to FIG. 5F, a rapid thermal oxidation process is carried out under the following conditions to oxidize the damage layer on the surface of the silicon substrate 30. In addition, the rapid thermal oxidation process oxidizes the side walls of the titanium polycide gate electrode which comprises the silicon-rich titanium silicide layer 38 and the phosphorus-doped polysilicon film 36. As a result, the rapid thermal oxidation process forms a silicon dioxide film 44 which extends on the top surface of the silicon substrate 30 and on side walls of the silicon-rich titanium silicide layer 38 and the phosphorus-doped polysilicon film 36, whereby the damage layer on the surface of the silicon substrate 30 becomes the silicon dioxide film 44.

Conditions for Rapid Thermal Oxidation:
  Atmosphere: oxygen atmosphere
  Temperature: in the range of 950° C. to 1050° C., for example
  Time: in the range of 30 seconds to 90 seconds, for example, 60 seconds.
  Thickness of the silicon dioxide 44 on the top surface of the substrate 30: in the range of 4 nanometers to 8 nanometers.

Figure 5G:
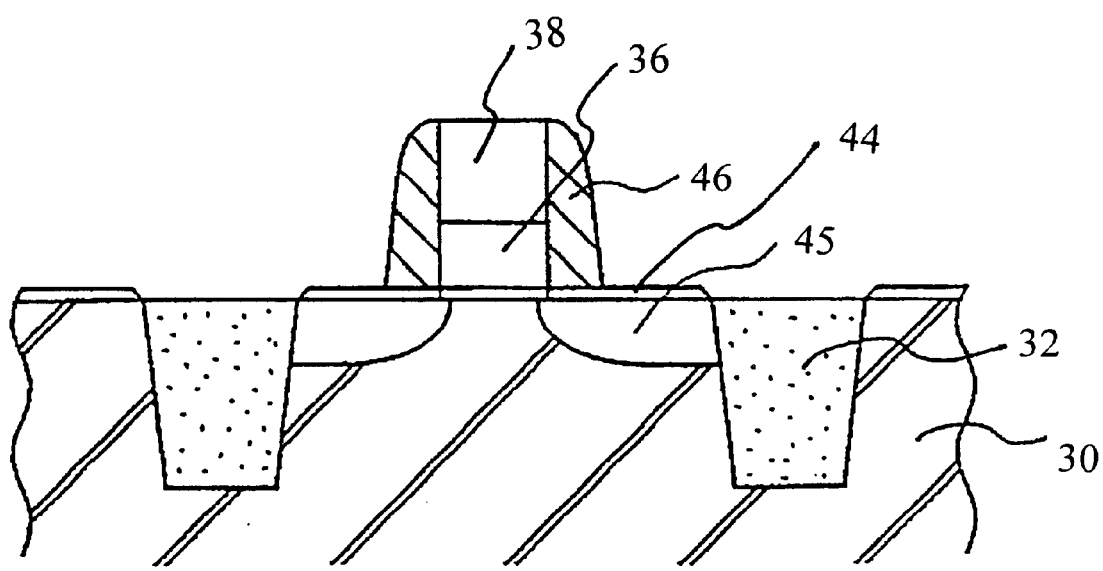

With reference to FIG. 5G, an ion-implantation of impurity is carried out by use of the silicon nitride mask 42 and the titanium polycide gate electrode as a mask to form self-aligned source and drain diffusion regions 45 in selected upper regions of the silicon substrate 30. A low pressure chemical vapor deposition process is carried out to entirely deposit a silicon nitride film having a thickness of 100 nanometers. An anisotropic etching process is carried out for etching back to the silicon nitride film, so that the silicon nitride film selectively remains only on side walls of the titanium polycide gate electrode which comprises the silicon-rich titanium silicide layer 38 and the phosphorus-doped polysilicon film 36. As a result, side wall insulation films 46 are formed on the side walls of the titanium polycide gate electrode which comprises the silicon-rich titanium silicide layer 38 and the phosphorus-doped polysilicon film 36.

As described above, the above novel silicon-rich titanium silicide layer 38 on the polysilicon layer 36 of the titanium polycide gate has a compositional ratio of silicon to titanium being 1:2.4. The rapid thermal oxidation process for oxidizing the damage layer on the top surface of the silicon substrate causes excess silicon to be oxidized in the range of 4 nanometers to 8 nanometers, but does not cause titanium of the titanium silicide layer to be oxidized, whereby a planarity of the silicon-rich titanium silicide layer 38 is maintained by the rapid thermal oxidation process for oxidizing the damage layer on the top surface of the silicon substrate. As a result, the sheet resistance of the titanium polycide gate electrode remains low and the stability of the sheet resistance of the gate electrode remains high. No film peeling nor breaking of the titanium polycide gate electrode is caused.

Second Embodiment

A second embodiment according to the present invention will be described in detail with reference to the drawings. FIGS. 7A through 7F are fragmentary cross sectional elevation views illustrative of semiconductor devices with titanium polycide gate electrodes in sequential steps involved in a novel method of forming the semiconductor device in a second embodiment according to the present invention.

Figure 7A:
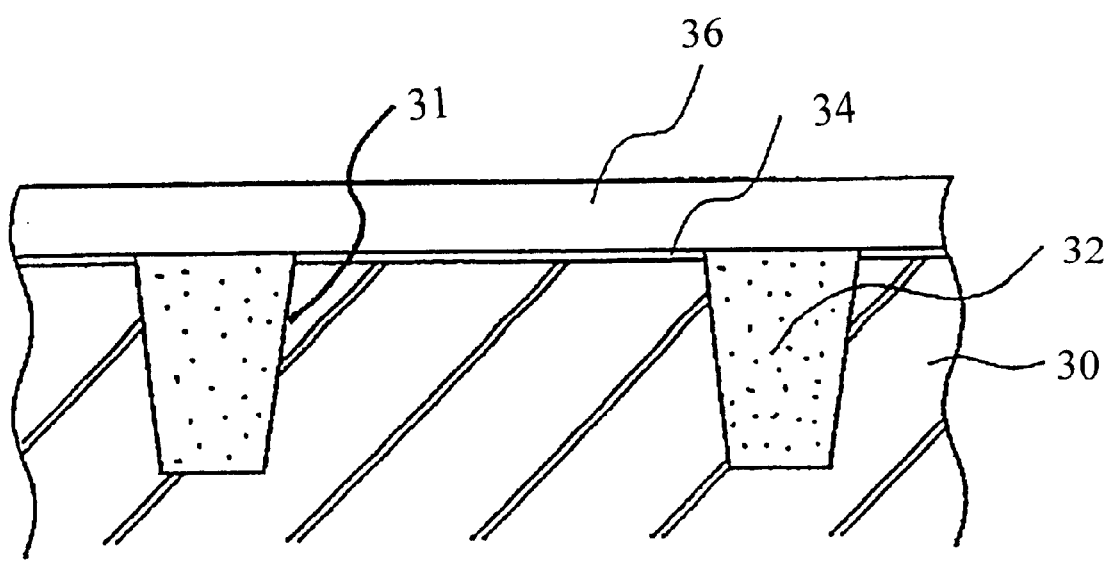
FIGS. 7A through 7F are fragmentary cross sectional elevation views illustrative of semiconductor devices with titanium polycide gate electrodes in sequential steps involved in a novel method of forming the semiconductor device in a second embodiment according to the present invention.

With reference to FIG. 7A, shallow trench isolation grooves 31 are selectively formed in an upper region of a silicon substrate 30 and subsequently shallow trench isolations 32 are formed within the trench isolation grooves 31 by use of a shallow trench isolation technique, whereby a device region of a top surface of the silicon substrate 30 is defined by the shallow trench isolations 32. A thermal oxidation reactor is used to carry out a thermal oxidation at a temperature of 850° C. in an oxygen atmosphere, whereby a gate oxide film 34 of $SiO_2$ is formed on the device region of the top surface of the silicon substrate 30. The gate oxide film 34 has a thickness of 5 nanometers.

A low pressure chemical vapor deposition process is carried out for entirely depositing a polysilicon film 36 which extends over the gate oxide film 34 and the top surfaces of the shallow trench isolations 32. The polysilicon film 36 has a thickness of 50 nanometers. An impurity such as phosphorus is doped into the polysilicon film 36. In order to dope phosphorus into the polysilicon film 36, the following methods are available. An ion-implantation may be carried out of ion-implanting phosphorus into the polysilicon film 36. Alternatively, a $POCl_3$ gas may be used to cause a diffusion of phosphorus into the polysilicon film 36. Further, alternatively, a $PH_3$ gas may be supplied into a growth chamber to deposit the phosphorus-doped polysilicon film 36 on the gate oxide film 34.

Figure 7B:
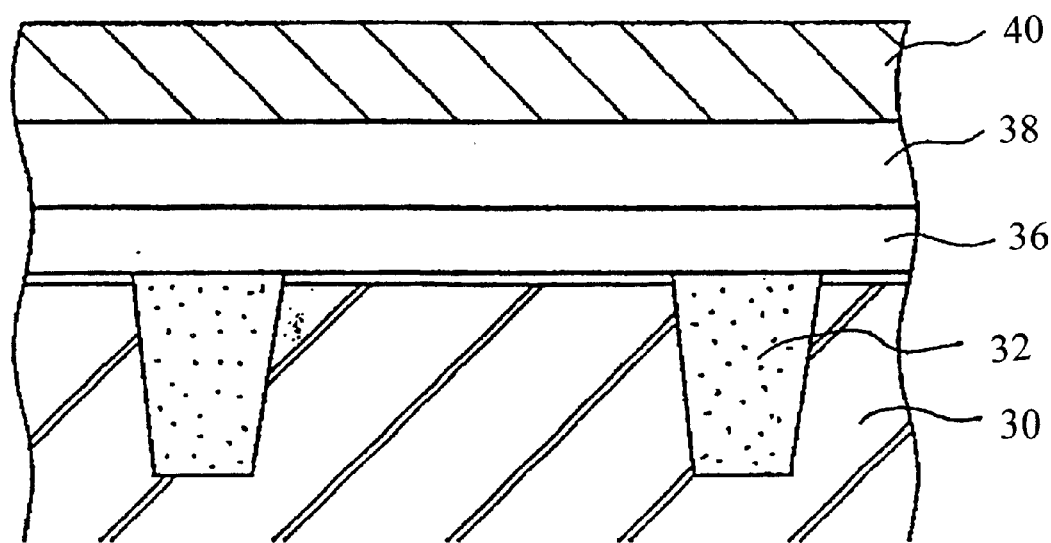

With reference to FIG. 7B, a sputtering process is carried out at a substrate temperature of 400° C. by sputtering a spatter-target which comprises a Ti-Si alloy having a compositional ratio of Ti to Si being 1:2.4 for depositing a crystallized silicon-rich titanium silicide layer 38 on the phosphorus-doped polysilicon film 36. The crystallized silicon-rich titanium silicide layer 38 has a compositional ratio of Ti to Si being 1:2.4. The crystallized silicon-rich titanium silicide layer 38 also has a thickness of 100 nanometers. The crystallized silicon-rich titanium silicide layer 38 is substantially identical in compositional ratio of Ti to Si to the sputter-target. The sputtering process is carried out by use of the same sputtering system 50 as shown in FIG. 6 as in the first embodiment. The descriptions about the sputtering-system 50 will be omitted to avoid the duplicate descriptions.

Further, a plasma enhanced chemical vapor deposition or a low pressure chemical vapor deposition is carried out to deposit a silicon nitride film 40 on the silicon-rich titanium silicide layer 38. The silicon nitride film 40 has a thickness of 100 nanometers.

Figure 7C:
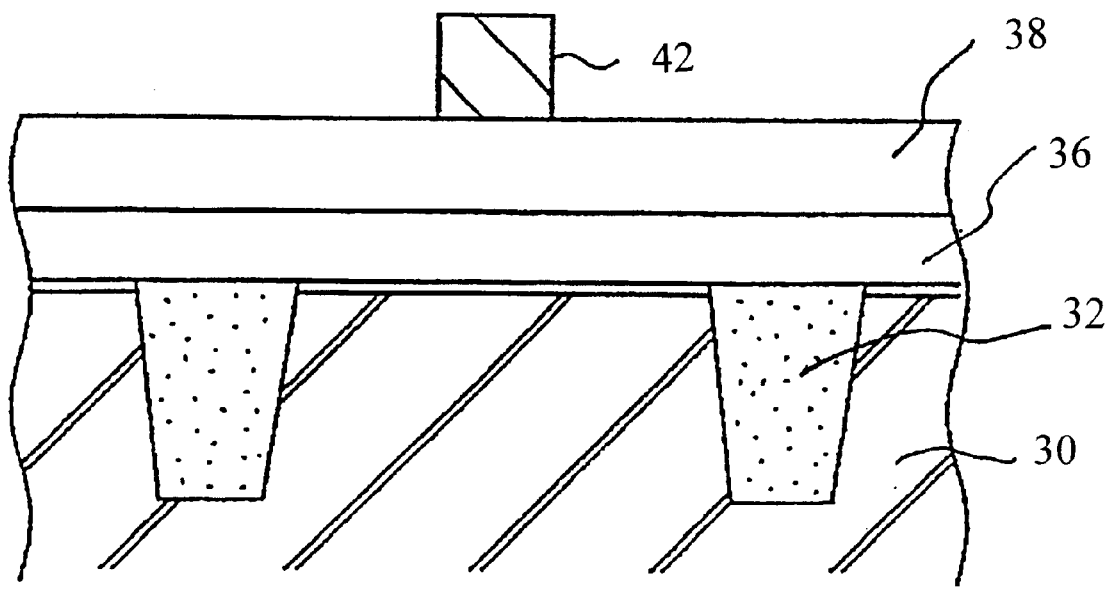

With reference to FIG. 7C, a photo-resist film not illustrated is entirely applied on the silicon nitride film 40. A photo-lithography is carried out to pattern the photo-resist film to form a photo-resist pattern on a predetermined region of the top surface of the silicon nitride film 40, wherein the photo-resist pattern is not illustrated. An isotropic etching process is then carried out by use of the photo-resist pattern as a mask and a CF-based etching gas for patterning the silicon nitride film 40, thereby to form a silicon nitride mask 42 on a predetermined region of the top surface of the silicon-rich titanium silicide layer 38. The used photo-resist pattern is then removed.

Figure 7D:
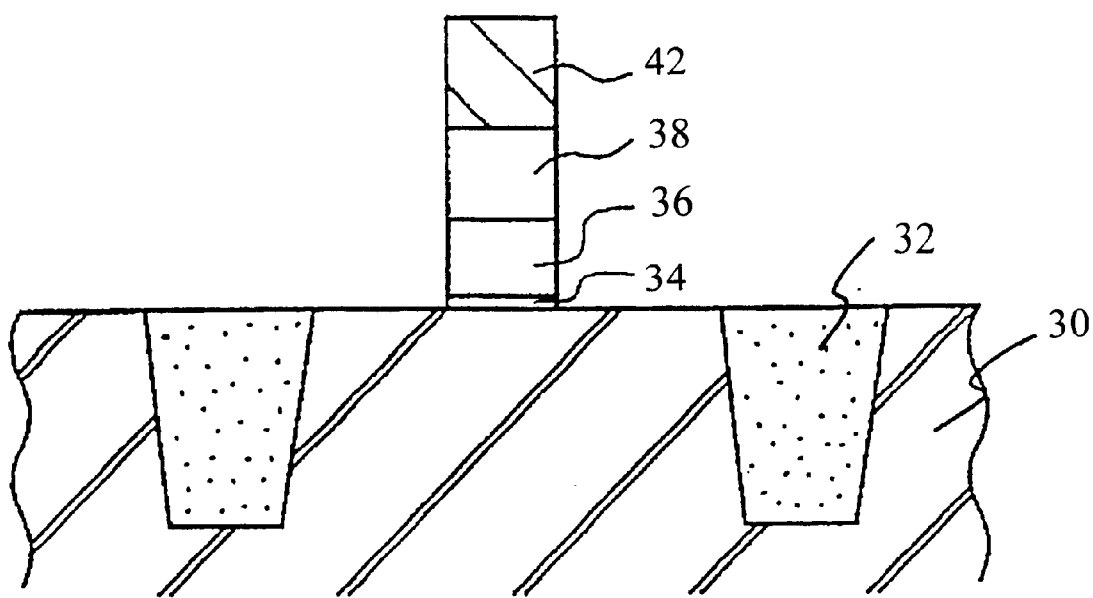

With reference to FIG. 7D, an anisotropic etching process is carried out by use of the silicon nitride mask 42 as an etching mask for selectively removing laminations of the silicon-rich titanium silicide layer 38, the phosphorus-doped polysilicon film 36 and the gate oxide film 34, whereby the silicon-rich titanium silicide layer 38 and the phosphorus-doped polysilicon film 36 are patterned to form a titanium polycide gate electrode which comprises the silicon-rich titanium silicide layer 38 and the phosphorus-doped polysilicon film 36 over the gate oxide film 34. A surface of the silicon substrate 30 receives a damage by the anisotropic etching process, whereby a damage layer is formed on the surface of the silicon substrate 30. The anisotropic etching process may be carried out under either the following first or second conditions.

First Etching Conditions:
  Sputter chamber pressure: 50 mTorr.
  Sputter gas flow rate: Hbr: 100 sccm and $O_2$:3 sccm.
  Plasma power: 300 W.
  Substrate temperature: 40° C.

Second Etching Conditions:
  Sputter chamber pressure: 30 mTorr.
  Sputter gas flow rate: Hbr: 100 sccm and $O_2$:1 sccm.
  Plasma power: 300 W.
  Substrate temperature: 80° C.

If the anisotropic etching process is carried out under the above first etching conditions, then a damage, that the surface of the silicon substrate 30 receives, is large whilst a verticality of side walls of the titanium polycide gate electrode is high. If the anisotropic etching process is carried out under the above second etching conditions, then the damage, that the surface of the silicon substrate 30 receives, is small whilst the verticality of the side walls of the titanium polycide gate electrode is low.

Figure 7E:
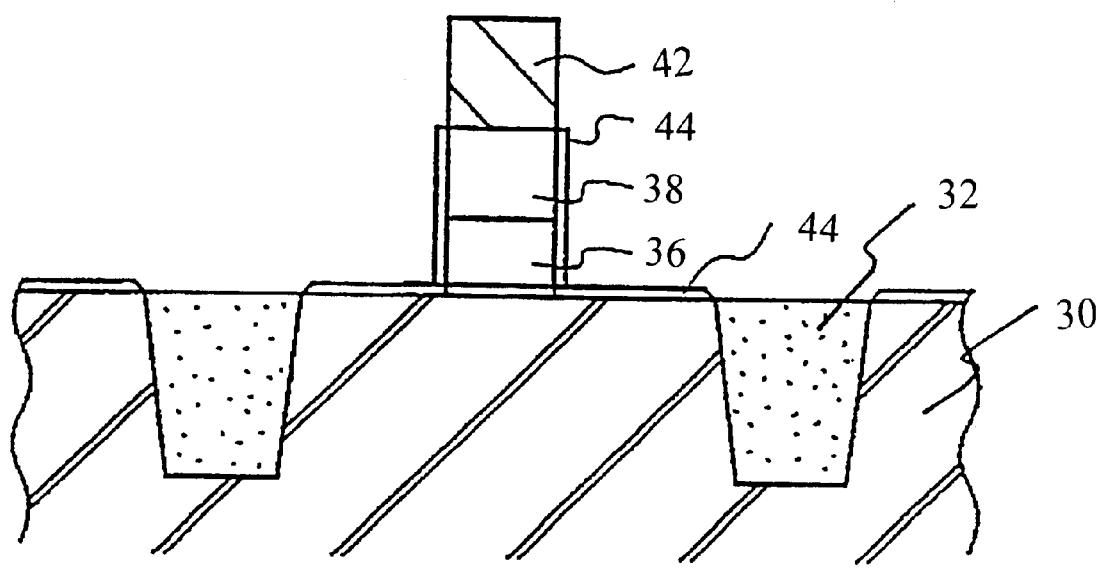

With reference to FIG. 7E, a rapid thermal oxidation process is carried out under the following conditions to oxidize the damage layer on the surface of the silicon substrate 30. In addition, the rapid thermal oxidation process oxidizes the side walls of the titanium polycide gate electrode which comprises the silicon-rich titanium silicide layer 38 and the phosphorus-doped polysilicon film 36. As a result, the rapid thermal oxidation process forms a silicon dioxide film 44 which extends on the top surface of the silicon substrate 30 and on side walls of the silicon-rich titanium silicide layer 38 and the phosphorus-doped polysilicon film 36, whereby the damage layer on the surface of the silicon substrate 30 becomes the silicon dioxide film 44.

Conditions for Rapid Thermal Oxidation:
  Atmosphere: oxygen atmosphere
  Temperature: in the range of 950° C. to 1050° C., for example 1000° C.
  Time: in the range of 30 seconds to 90 seconds, for example, 60 seconds.
  Thickness of the silicon dioxide 44 on the top surface of the substrate 30: in the range of 4 nanometers to 8 nanometers.

Figure 7F:
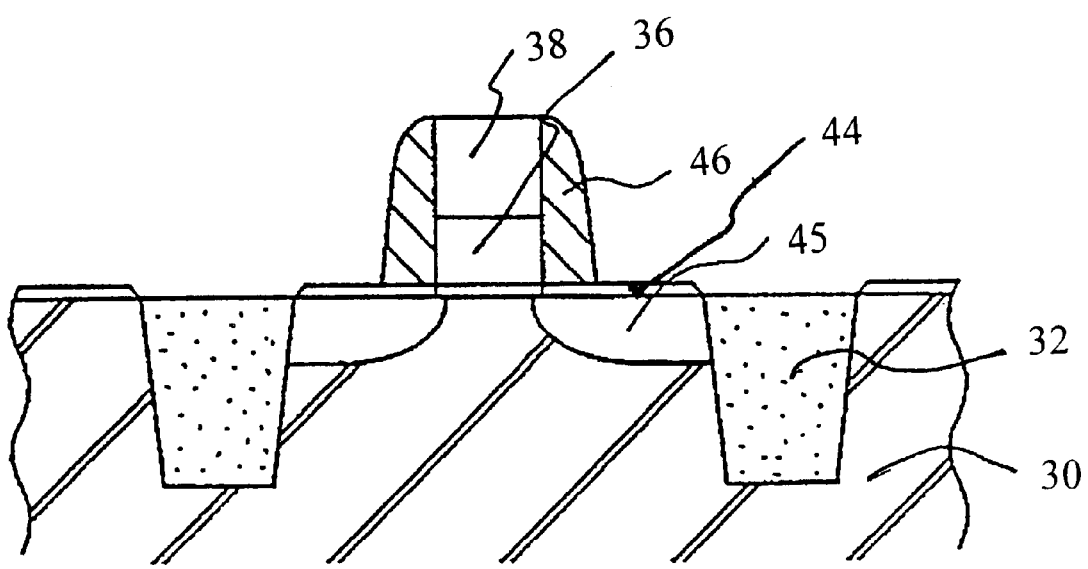

With reference to FIG. 7F, an ion-implantation of impurity is carried out by use of the silicon nitride mask 42 and the titanium polycide gate electrode as a mask to form self-aligned source and drain diffusion regions 45 in selected upper regions of the silicon substrate 30. A low pressure chemical vapor deposition process is carried out to entirely deposit a silicon nitride film having a thickness of 100 nanometers. An anisotropic etching process is carried out for etching back to the silicon nitride film, so that the silicon nitride film selectively remains only on side walls of the titanium polycide gate electrode which comprises the silicon-rich titanium silicide layer 38 and the phosphorus-doped polysilicon film 36. As a result, side wall insulation films 46 are formed on the side walls of the titanium polycide gate electrode which comprises the silicon-rich titanium silicide layer 38 and the phosphorus-doped polysilicon film 36.

As described above, the above novel silicon-rich titanium silicide layer 38 on the polysilicon layer 36 of the titanium polycide gate has a compositional ratio of silicon to titanium being 1:2.4. The rapid thermal oxidation process for oxidizing the damage layer on the top surface of the silicon substrate causes excess silicon to be oxidized in the range of 4 nanometers to 8 nanometers, but does not cause titanium of the titanium silicide layer to be oxidized, whereby a planarity of the silicon-rich titanium silicide layer 38 is maintained by the rapid thermal oxidation process for oxidizing the damage layer on the top surface of the silicon substrate. As a result, the sheet resistance of the titanium polycide gate electrode remains low and the stability of the sheet resistance of the gate electrode remains high. No film peeling nor breaking of the titanium polycide gate electrode is caused.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a titanium polycide layered structure, said method, comprising:
  forming a silicon-rich titanium silicide layer on a polysilicon layer by a sputtering process, such that, a compositional ratio of silicon to titanium of said silicon-rich titanium silicide layer exceeds 2.

2. The method as claimed in claim 1, further comprising:
  subjecting said titanium polycide layered structure to a rapid thermal oxidation, whereby excess silicon in exposed surface regions of said silicon-rich titanium silicide layer and said polysilicon layer are oxidized, and said silicon-rich titanium silicide layer, except for said exposed surface regions, remains substantially unchanged in said compositional ratio of said silicon-rich titanium silicide layer.

3. The method as claimed in claim 2, wherein said rapid thermal oxidation is carried out at a temperature in the range of 950° C. to 1050° C. in an oxygen atmosphere for a time period in the range of 30 seconds to 90 seconds for oxidizing said exposed surface regions to a depth in the range of 4 nanometers to 8 nanometers to form a silicon dioxide film having a thickness in the range of 4 nanometers to 8 nanometers on said exposed surface regions.

4. The method as claimed in claim 1, wherein said silicon-rich titanium silicide layer is formed by said sputtering process, such that, said compositional ratio of titanium to silicon of said silicon-rich titanium silicide layer is in a range of 1:2.3 to 1:2.5.

5. The method as claimed in claim 4, wherein said silicon-rich titanium silicide layer is formed by said sputtering process, such that, said compositional ratio of titanium to silicon of said silicon-rich titanium silicide layer is 1:2.4.

6. The method as claimed in claim 1, wherein forming said silicon-rich titanium silicide layer, includes:

depositing an amorphous silicon-rich titanium silicide layer on said polysilicon layer by said sputtering process, such that, said compositional ratio of silicon to titanium of said amorphous silicon-rich titanium silicide layer exceeds 2; and heating said amorphous silicon-rich titanium silicide layer to cause crystallization of said amorphous silicon-rich titanium silicide layer to form said silicon-rich titanium silicide layer.

7. The method as claimed in claim 6, wherein said compositional ratio of titanium to silicon of said amorphous silicon-rich titanium silicide layer is in the range of 1:2.3 to 1:2.5.

8. The method as claimed in claim 7, wherein said compositional ratio of titanium to silicon of said amorphous silicon-rich titanium silicide layer is 1:2.4.

9. The method as claimed in claim 1, wherein forming said silicon-rich titanium silicide layer is carried out at a temperature of not less than 400° C. to deposit a crystallized silicon-rich titanium silicide layer on said polysilicon layer.

10. The method as claimed in claim 9, wherein said compositional ratio of titanium to silicon of said crystallized silicon-rich titanium silicide layer is in the range of 1:2.3 to 1:2.5.

11. The method as claimed in claim 10, wherein said compositional ratio of titanium to silicon of said crystallized silicon-rich titanium silicide layer is 1:2.4.

12. The method as claimed in claim 2, further comprising patterning said silicon-rich titanium silicide layer and said polysilicon layer of said titanium polycide layered structure to form a titanium polycide gate electrode, before said titanium polycide gate electrode is subjected to a rapid thermal oxidation.

13. The method as claimed in claim 2, further comprising patterning said silicon-rich titanium silicide layer and said polysilicon layer of said titanium polycide layered structure to form a titanium silicide interconnection, before said titanium silicide interconnection is subjected to a rapid thermal oxidation.

14. A method of forming a titanium polycide gate electrode, said method, comprising:

forming a gate insulation film on a top surface of a semiconductor substrate;

forming a polysilicon layer on said gate insulation film;

forming a silicon-rich titanium silicide layer on said polysilicon layer by a sputtering process, such that, a compositional ratio of silicon to titanium of said silicon-rich titanium silicide layer exceeds 2;

patterning said polysilicon layer and said silicon-rich titanium silicide layer to form a titanium polycide gate electrode on said gate insulation film; and subjecting said titanium polycide gate electrode to a rapid thermal oxidation, whereby excess silicon in exposed surface regions of said silicon-rich titanium silicide layer and said polysilicon layer are oxidized, and said silicon-rich titanium silicide layer, except for said exposed surface regions, remains substantially unchanged in said compositional ratio of said silicon-rich titanium silicide layer.

15. The method as claimed in claim 14, wherein said rapid thermal oxidation is carried out at a temperature in the range of 950° C. to 1050° C. in an oxygen atmosphere for a time period in the range of 30 seconds to 90 seconds for oxidizing said exposed surface regions to a depth in the range of 4 nanometers to 8 nanometers to form a silicon dioxide film having a thickness in the range of 4 nanometers to 8 nanometers on said exposed surface regions.

16. The method as claimed in claim 14, wherein said silicon-rich titanium silicide layer is formed by said sputtering process, such that, said compositional ratio of titanium to silicon of said silicon-rich titanium silicide layer is in a range of 1:2.3 to 1:2.5.

17. The method as claimed in claim 16, wherein said silicon-rich titanium silicide layer is formed by said sputtering process, such that, said compositional ratio of titanium to silicon of said silicon-rich titanium silicide layer is 1:2.4.

18. The method as claimed in claim 14, wherein forming said silicon-rich titanium silicide layer includes:

depositing an amorphous silicon-rich titanium silicide layer on said polysilicon layer by said sputtering process, such that, said compositional ratio of silicon to titanium of said amorphous silicon-rich titanium silicide layer exceeds 2; and heating said amorphous silicon-rich titanium silicide layer to cause crystallization of said amorphous silicon-rich titanium silicide layer to form said silicon-rich titanium silicide layer.

19. The method as claimed in claim 18, wherein said compositional ratio of titanium to silicon of said amorphous silicon-rich titanium silicide layer is in the range of 1:2.3 to 1:2.5.

20. The method as claimed in claim 19, wherein said compositional ratio of titanium to silicon of said amorphous silicon-rich titanium silicide layer is 1:2.4.

21. The method as claimed in claim 14, wherein forming said silicon-rich titanium silicide layer is carried out at a temperature of not less than 400° C. to deposit a crystallized silicon-rich titanium silicide layer on said polysilicon layer.

22. The method as claimed in claim 21, wherein said compositional ratio of titanium to silicon of said crystallized silicon-rich titanium silicide layer is in the range of 1:2.3 to 1:2.5.

23. The method as claimed in claim 22, wherein said compositional ratio of titanium to silicon of said crystallized silicon-rich titanium silicide layer is 1:2.4.

24. The method as claimed in claim 14, further comprising, after said rapid thermal oxidation, forming silicon nitride side wall layers on side walls of said titanium polycide gate electrode.

* * * * *